(12) United States Patent  (10) Patent No.: US 8,819,336 B2
Kwon et al.  (45) Date of Patent: Aug. 26, 2014

(54) NONVOLATILE MEMORY SYSTEM AND RELATED METHOD OF PRESERVING STORED DATA DURING POWER INTERRUPTION

(71) Applicant: Samsung Electronics Co., Ltd., Suwon-si (KR)

(72) Inventors: Min cheol Kwon, Seoul (KR); Woon Hyug Jee, Suwon-si (KR); Dong Jun Shin, Hwaseong-si (KR); Shine Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/032,953

(22) Filed: Sep. 20, 2013

(65) Prior Publication Data

US 2014/0025874 A1  Jan. 23, 2014

Related U.S. Application Data

(63) Continuation of application No. 12/821,338, filed on Jun. 23, 2010, now Pat. No. 8,554,990.

(30) Foreign Application Priority Data

Oct. 16, 2009  (KR) ........................ 10-2009-0098615

(51) Int. Cl.
*G06F 12/00* (2006.01)
*G06F 12/02* (2006.01)

(52) U.S. Cl.
CPC ........ *G06F 12/0238* (2013.01); *G06F 12/0246* (2013.01)
USPC ......................................... 711/103

(58) Field of Classification Search
CPC .................... G06F 12/0238; G06F 12/0246
See application file for complete search history.

(56) References Cited

U.S. PATENT DOCUMENTS

2009/0007090 A1  1/2009  Hirao et al.

FOREIGN PATENT DOCUMENTS

| CN | 101334736 A | 12/2008 |
|---|---|---|
| JP | 2000-298621 | 10/2000 |
| JP | 2009-009392 | 1/2009 |
| KR | 1020060090088 A | 8/2006 |

*Primary Examiner* — Brian Peugh
(74) *Attorney, Agent, or Firm* — Volentine & Whitt, PLLC

(57) ABSTRACT

A nonvolatile memory system comprises a temporary power supply that supplies power in the event of an unexpected power interruption. The temporary power supply provides power while metadata stored in one or more buffers is compressed and transferred to a nonvolatile memory device.

23 Claims, 18 Drawing Sheets

Fig. 6
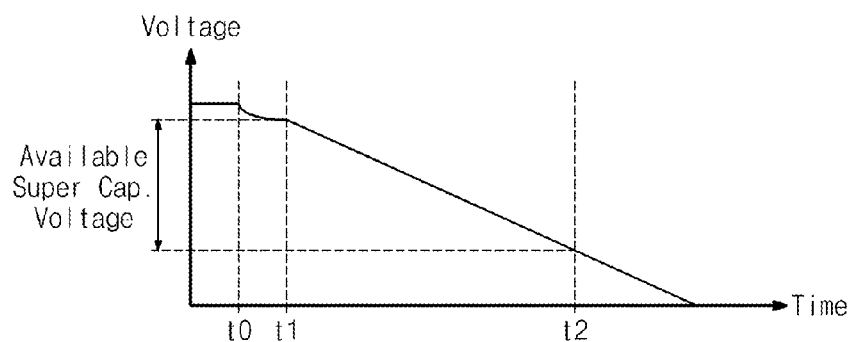
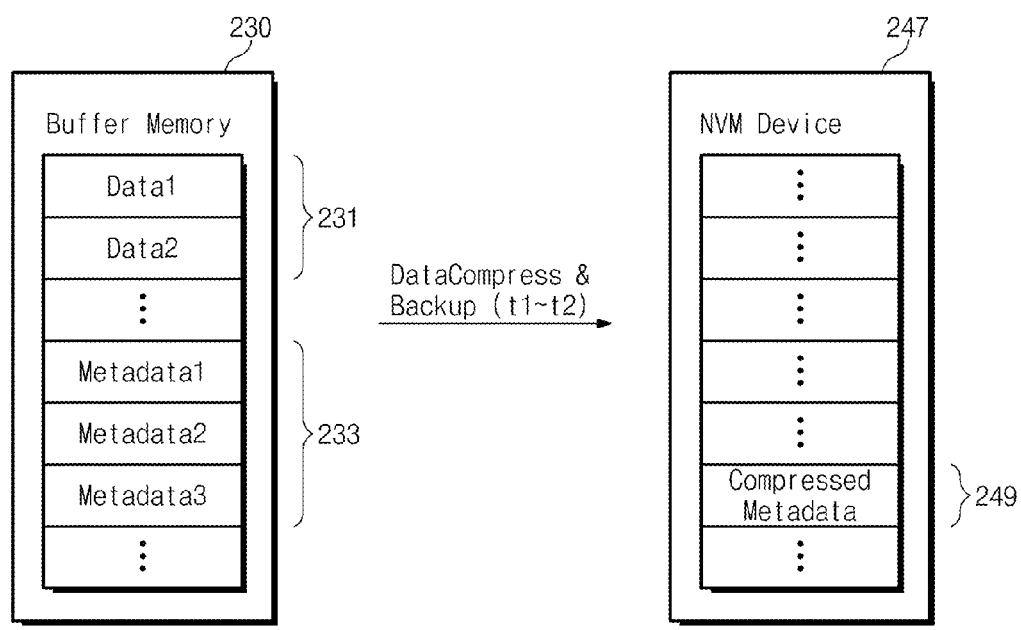

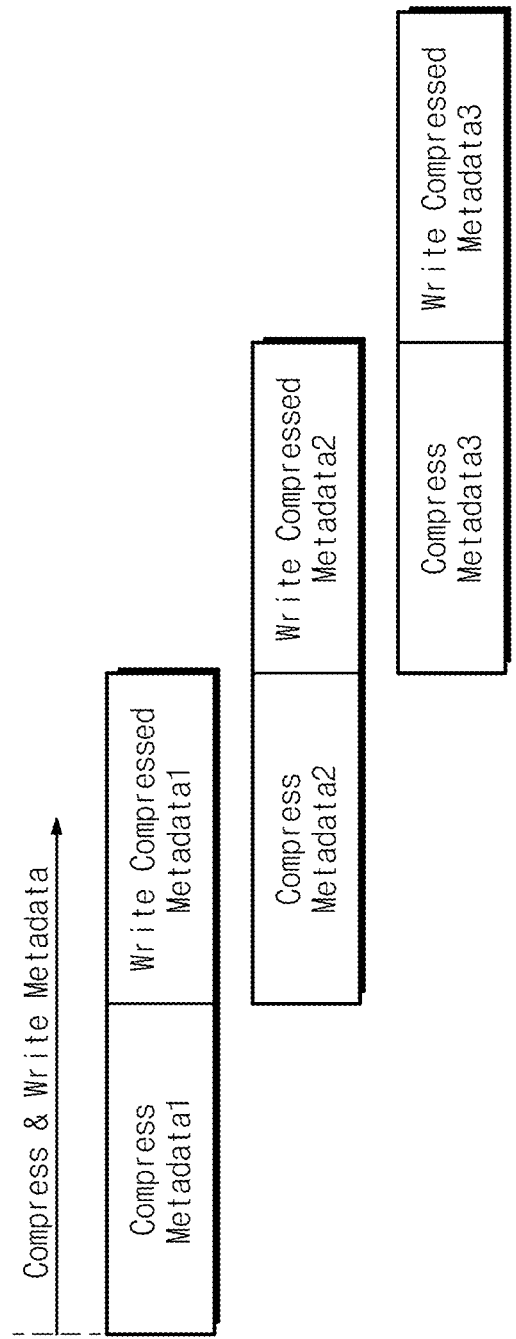

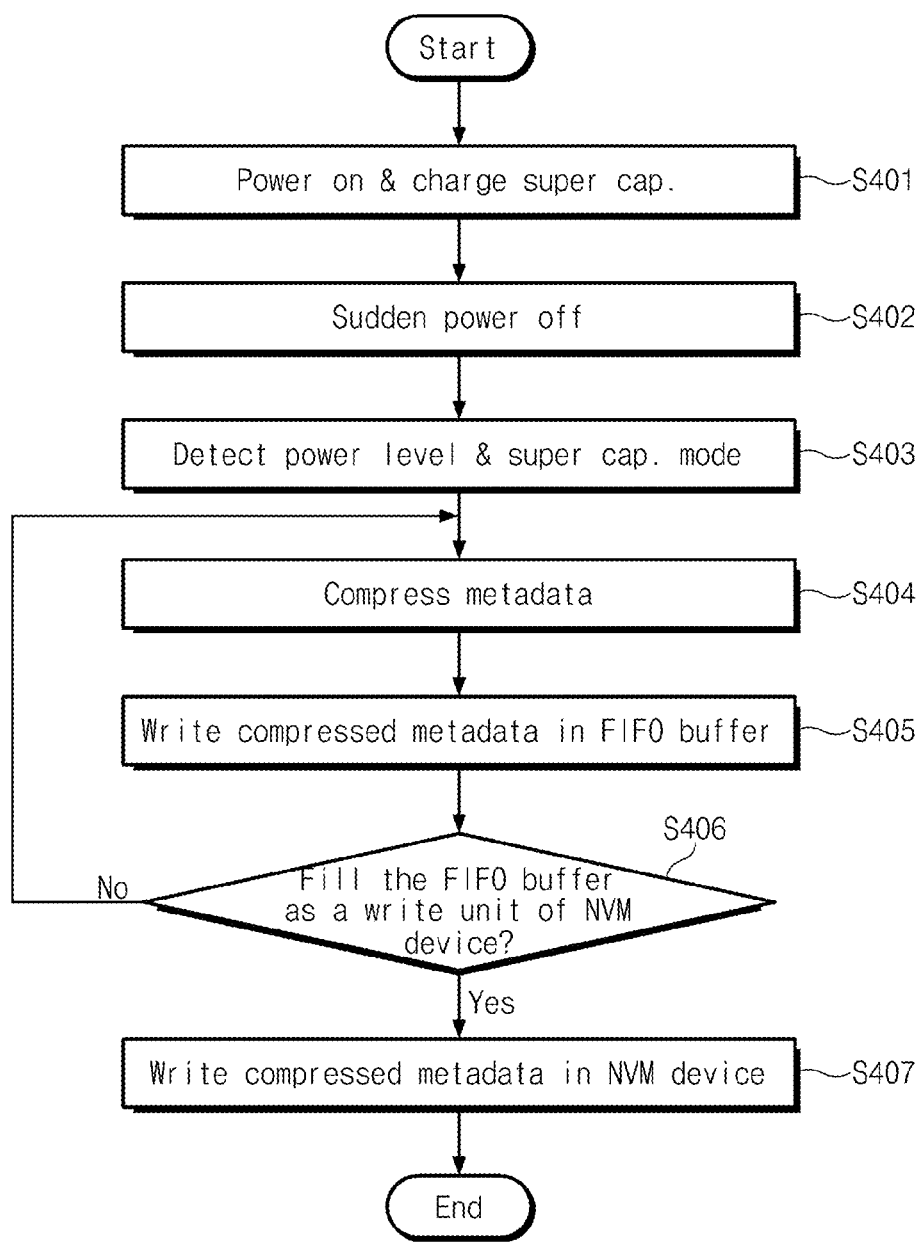

NONVOLATILE MEMORY SYSTEM AND RELATED METHOD OF PRESERVING STORED DATA DURING POWER INTERRUPTION

CROSS-REFERENCE TO RELATED APPLICATIONS

This is a Continuation of U.S. Non-Provisional application Ser. No. 12/821,338, filed Jun. 23, 2010, now U.S. Pat. No. 8,554,990, which claims priority under 35 U.S.C. §119 to Korean Patent Application No. 10-2009-0098615 filed on Oct. 16, 2009, the disclosure of which is hereby incorporated by reference in its entirety.

BACKGROUND

Embodiments of the inventive concept relate generally to nonvolatile memory systems. More particularly, embodiments of the inventive concept relate to nonvolatile memory systems capable of preventing data loss in the presence of power interruption.

Semiconductor memory devices can be roughly classified into two categories including volatile memory devices, which lose stored data when disconnected from power, and nonvolatile memory devices, which retain stored data when disconnected from power. Examples of volatile memory devices include dynamic random access memory (DRAM) and static random access memory (SRAM), and examples of nonvolatile memory devices include electrically erasable and programmable read-only memory (EEPROM), ferroelectric random access memory (FRAM), phase-change random access memory (PRAM), magnetic random access memory (MRAM), and flash memory.

Among the nonvolatile memory devices, flash memory is known for having relatively high program speed, low power consumption, and large storage capacity. Accordingly, flash memory devices have been adopted as data storage media in a wide variety of electronic devices, such as MP3 players, digital cameras, solid state drives (SSDs) and computer systems, to name but a few.

Nonvolatile memories such as flash memory are commonly incorporated into nonvolatile memory systems, such as SSDs, to provide mass data storage for various electronic applications. A nonvolatile memory system typically receives power from an external or internal power supply, such as a 110V or 220V AC power supply, or a DC power supply such as a battery.

Unfortunately, power supplies are susceptible to failures, which can lead to loss of data even in nonvolatile memory devices. For instance, if the power supply of a nonvolatile memory device is unexpectedly interrupted during a programming operation, some memory cells in the nonvolatile memory device may be left in an unknown state, which can potentially lead to catastrophic system malfunctions.

SUMMARY

Embodiments of the inventive concept provide nonvolatile memory systems that back up metadata stably in the event of unexpected power interruption.

According to one embodiment of the inventive concept, a nonvolatile memory system comprises a first buffer memory configured to store metadata, a data compressor configured to compress the metadata, a plurality of nonvolatile memory devices configured to store the compressed metadata, and a memory system control unit configured to control the data compressor to compress the metadata stored in the first buffer memory while power is supplied to the nonvolatile memory system by a temporary power supply, and further configured to control at least one of the nonvolatile memory devices to store the compressed metadata.

In certain embodiments, controlling the data compressor to compress the metadata and controlling the nonvolatile memory device to store the compressed metadata are performed in parallel. In certain embodiments, the method further comprises a second buffer memory configured to store the compressed metadata. In certain embodiments, the compressed metadata is transmitted to the nonvolatile memory device from the second buffer memory in units corresponding to a write unit of the at least one nonvolatile memory device. In certain embodiments, the second buffer memory receives and transmits the compressed metadata in a first-in-first-out fashion.

In certain embodiments, the metadata is stored in the nonvolatile memory device during a standby operation where the memory system control unit receives no read or write request from an external device. In certain embodiments, the metadata is compressed by the data compressor prior to its storage in the nonvolatile memory device. In certain embodiments, the data compressor compresses only updated metadata among the metadata stored in the first buffer memory while power is supplied to the nonvolatile memory system from the temporary power supply.

In certain embodiments, the nonvolatile memory device comprises a reserved area allocated to store the compressed metadata. In certain embodiments, the reserved area is configured to operate in a single-level cell mode. In certain embodiments, the compressed metadata is transmitted to the nonvolatile memory devices in a distributed manner. In certain embodiments, the nonvolatile memory system is an SSD comprising a plurality of flash memory devices. In certain embodiments, the second buffer memory is a reserved area of the first buffer memory or is incorporated in the data compressor.

According to another embodiment of the inventive concept, a method of managing data of a nonvolatile memory system driven by a temporary power supply in the event of an unexpected power supply failure is provided. The method comprises compressing metadata of the nonvolatile memory system, storing the compressed metadata in a buffer memory, and storing the temporarily-stored compressed metadata in a plurality of nonvolatile memory devices.

In certain embodiments, compressing of the metadata and storing the compressed metadata are performed in parallel. In certain embodiments, the method further comprises storing the metadata in the nonvolatile memory device during a standby operation where no read or write request is received by a memory controller from an external device.

In certain embodiments, the method further comprises compressing only updated metadata among the metadata while power is supplied to the nonvolatile memory system from the temporary power supply, and storing the compressed updated metadata in the nonvolatile memory device.

In certain embodiments, compressing only the updated metadata among the metadata and storing the compressed updated metadata are performed in parallel. In certain embodiments, the nonvolatile memory device comprises a reserved area for storing the compressed metadata and the reserved area operates in a single-level cell mode.

In certain embodiments, the compressed metadata is transmitted to the nonvolatile memory devices in a distributed manner.

BRIEF DESCRIPTION OF THE DRAWINGS

Embodiments of the inventive concept are described below with reference to the accompanying drawings. In the drawings, like reference numbers denote like features.

FIG. 6 includes a voltage diagram and two memory diagrams illustrating the operation of the nonvolatile memory system during the discharge of a super capacitor of FIG. 5.

FIGS. 9A and 9B are diagrams illustrating a metadata backup process performed in the event of unexpected power interruption according to an embodiment of the inventive concept.

FIG. 10 is a flow chart illustrating a metadata backup process performed in the event of unexpected power interruption according to an embodiment of the inventive concept.

DETAILED DESCRIPTION OF THE EMBODIMENTS

Embodiments of the inventive concept are described below with reference to the accompanying drawings. The described embodiments are provided as teaching examples and should not be construed to limit the scope of the inventive concept.

Figure 1:
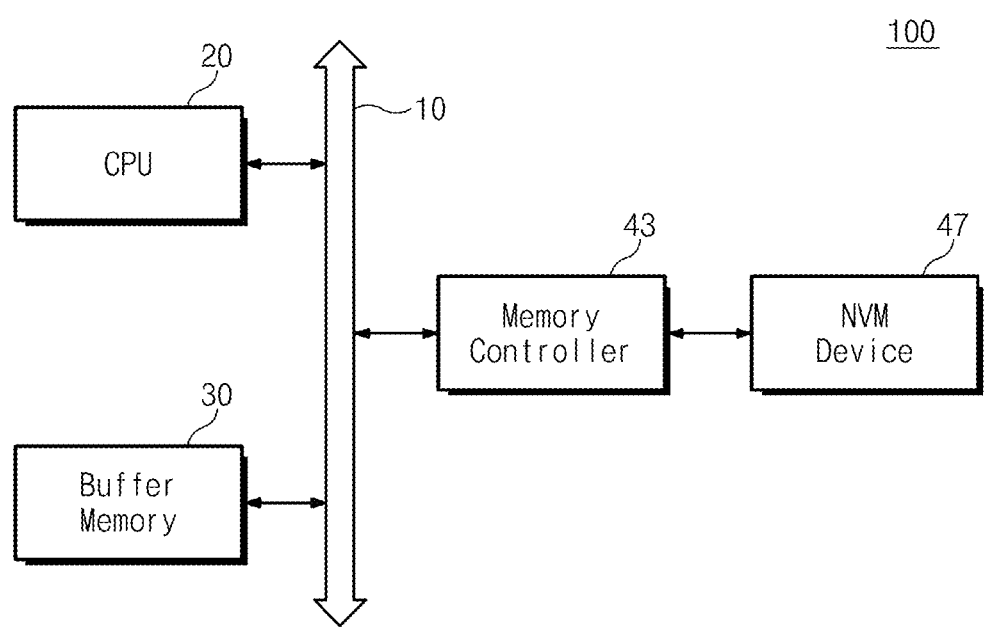
FIG. 1 is a block diagram illustrating a nonvolatile memory system comprising a flash memory device according to an embodiment of the inventive concept.

FIG. 1 is a block diagram illustrating a nonvolatile memory system 100 comprising a flash memory device according to an embodiment of the inventive concept.

Referring to FIG. 1, nonvolatile memory system 100 comprises a system bus 10, a central processing unit (CPU) 20, a buffer memory 30, a memory controller 43, and a nonvolatile memory (NVM) device 47.

For explanation purposes, it will be assumed that nonvolatile memory device 47 comprises a plurality of NAND flash memories. However, nonvolatile memory device 47 is not limited to NAND flash memory, and could comprise other forms of nonvolatile memory, such as NOR flash memory, PRAM, FRAM, and MRAM.

System bus 10 provides a data transfer path between components of nonvolatile memory system 100. CPU 20 controls nonvolatile memory system 100 to perform operations requested by a host system (not shown), such as read and write operations. To control nonvolatile memory system 100, CPU 20 temporarily stores firmware in buffer memory 30 and executes the stored firmware to issue a series of read or write commands to flash memory 47. Flash memory controller 43 controls flash memory 47 directly in response to read and write requests from CPU 20.

Figure 2:
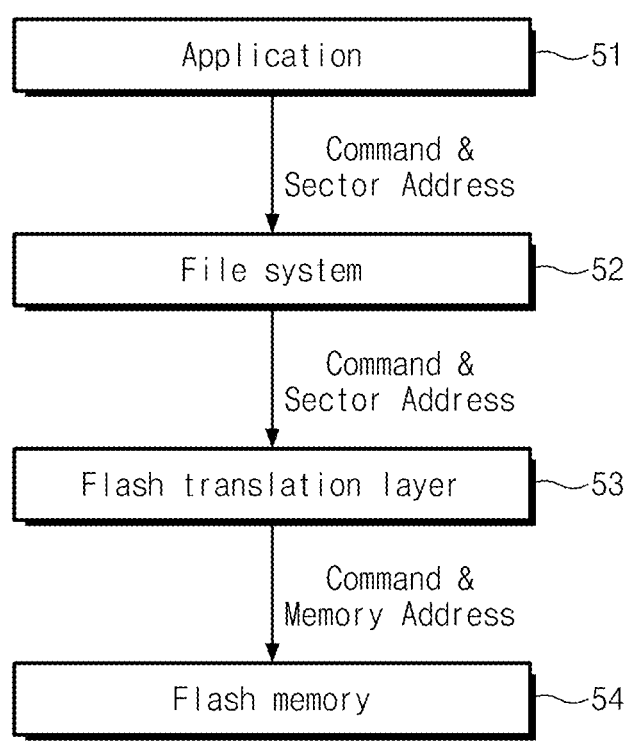
FIG. 2 is a diagram illustrating a software architecture of the nonvolatile memory system of FIG. 1.

FIG. 2 is a diagram illustrating a software architecture of nonvolatile memory system 100 of FIG. 1.

Referring to FIG. 2, the host system (not illustrated) has software layers comprising a file system 52 and an application 51. Nonvolatile memory system 100 has a software layer comprising a flash translation layer (FTL) 53 and a hardware layer comprising a flash memory 54.

Upon receiving a read or write request from application 51, file system 52 transfers a read or write sector address and a corresponding command to FTL 53. FTL 53 transfers the received command to flash memory 54. FTL 53 also translates the received sector address into a memory address of flash memory 54 and transfers the memory address to flash memory 54.

Figure 3A:
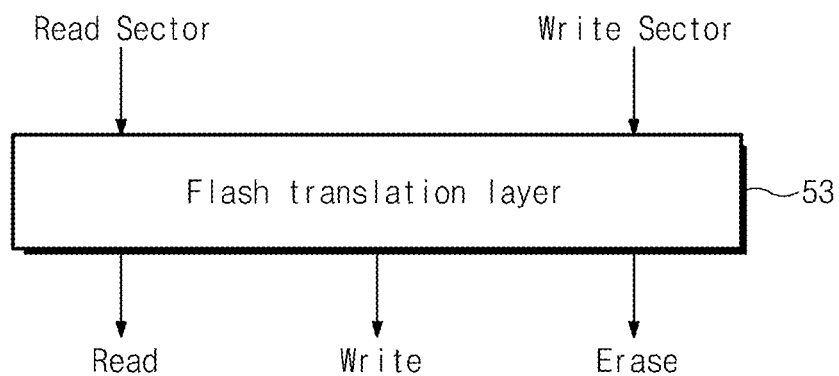
FIGS. 3A and 3B are block diagrams illustrating a flash translation layer of FIG. 2.
Figure 3B:
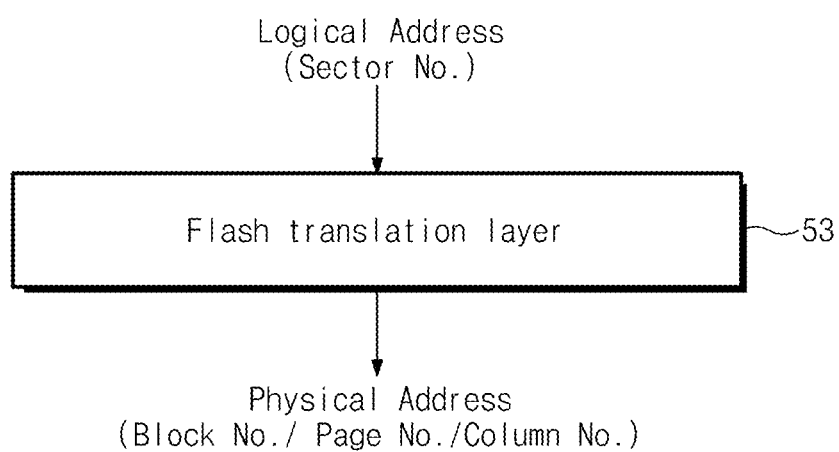

FIGS. 3A and 3B are block diagrams illustrating FTL 53 of FIG. 2. In particular, FIG. 3A illustrates a command translation aspect of FTL 53 and FIG. 3B illustrates an address translation aspect of FTL 53.

Referring to FIG. 3A, FTL 53 receives read and write commands and translates the read and write commands into various combinations of read, write, and erase commands to be transmitted to flash memory 54. In one example, FTL 53 receives a write command from file system 52 and translates the write command into an erase command and one or more write commands. One reason for adding an erase command is that flash memory 54 must be erased before it can be overwritten. In other words, flash memory 54 cannot be overwritten in place. Additionally, the erase operation of flash memory 54 typically erases an entire block of memory cells, and the block may include data that should be retained. Accordingly, FTL 53 may be further required to implement move commands to retain the stored data in another location.

When receiving a read or write request for a sector address from file system 52 (i.e., the upper layer), FTL 53 performs command translation to enable flash memory 54 to perform a read or write operation. Also, FTL 53 manages bad blocks of flash memory 54 and monitors the wear level of each block.

Referring to FIG. 3B, FTL 53 maps a logical address received from file system 52 to a physical address of flash memory 54. FTL 53 translates a sector address, which is a logical address on a virtual disk received from file system 52, into a block number, a page number or a column number that is a physical address on flash memory 54. This address translation is typically performed with reference to an address mapping table managed by FTL 53.

Figure 4:
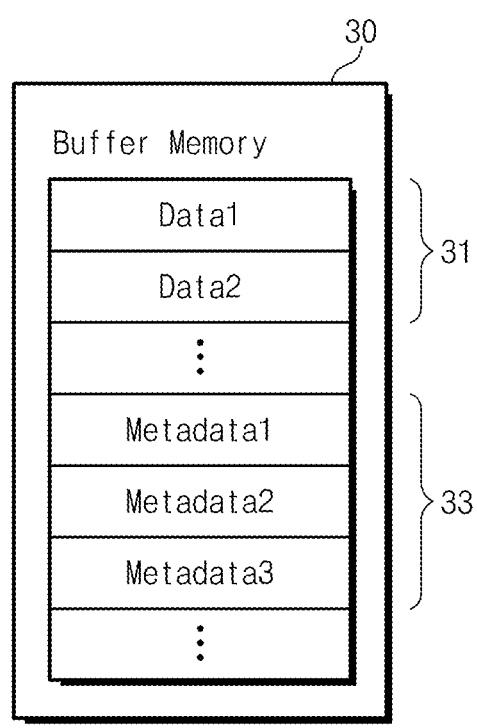
FIG. 4 is a diagram illustrating a data structure stored in a buffer memory of the nonvolatile memory system of FIG. 1.

FIG. 4 is a diagram illustrating a data structure stored in buffer memory 30 of nonvolatile memory system 100.

Referring to FIGS. 1 and 4, buffer memory 30 comprises a volatile memory, such as a DRAM, SRAM, PRAM, or any other type of volatile memory. CPU 20 temporarily stores data read from flash memory 47 in buffer memory 30 before providing the data to the host system. CPU 20 temporarily stores data to be written in nonvolatile memory system 100 in buffer memory 30 before writing the data in flash memory 47. The data to be provided to the host system or the data received from the host system typically comprises data executed by application 51 and metadata of the host system used for data management. The data is typically stored temporarily in a first area 31 of buffer memory 30.

CPU 20 executes firmware to control nonvolatile memory system 100. The firmware is temporarily stored in first area 31 of buffer memory 30. CPU 20 also temporarily stores in buffer memory 30 system data generated and updated during execution of the firmware.

The system data comprises program sequence data and register data generated and updated during firmware execution. The system data typically further comprises wear level data, bad block data, and address mapping data managed by FTL 53 of FIG. 2. This data is referred to as management data, or metadata, of nonvolatile memory system 100, and is stored in a second area 33 of buffer memory 30.

Figure 5:
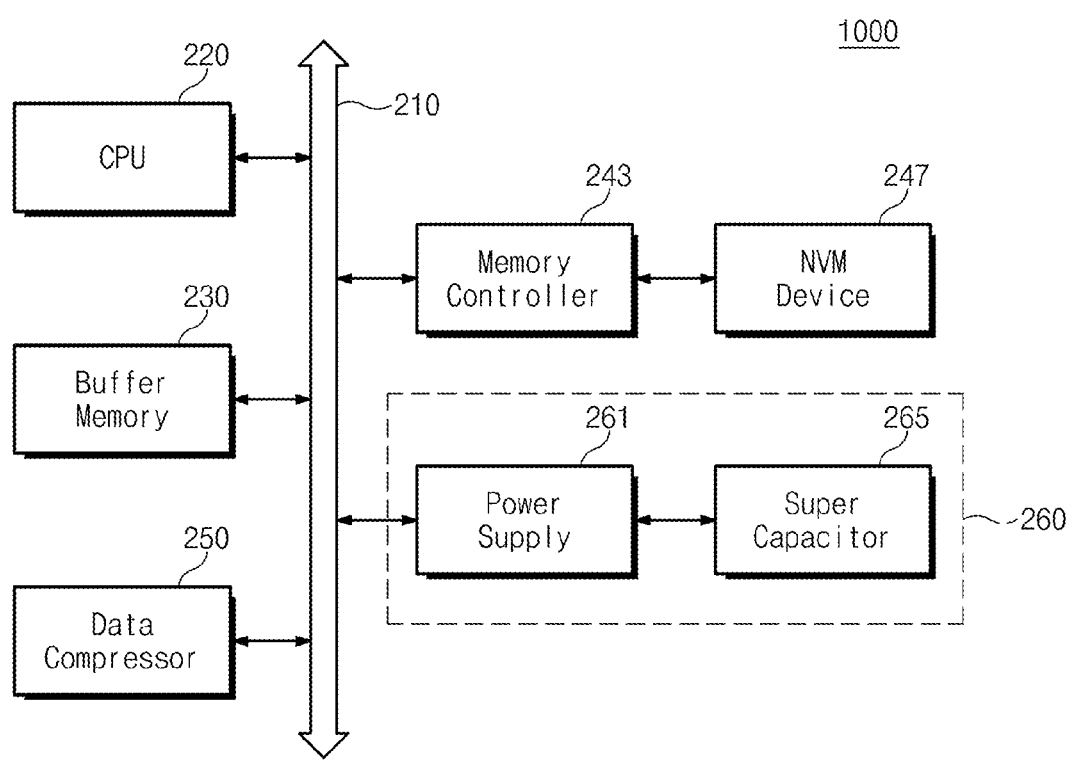
FIG. 5 is a block diagram illustrating a nonvolatile memory system according to another embodiment of the inventive concept.

FIG. 5 is a block diagram illustrating a nonvolatile memory system 1000 according to another embodiment of the inventive concept. For explanation purposes, it will be assumed that nonvolatile memory system 1000 comprises an SSD using one or more flash memory devices as its storage medium. The inventive concept, however, is not limited to an SSD.

Referring to FIG. 5, SSD 1000 comprises a system bus 210, a CPU 220, a buffer memory 230, a memory controller 243, a nonvolatile memory device 247, a data compressor 250, and a power supply 260.

Nonvolatile memory device 247 typically comprises a plurality of NAND flash memories. However, nonvolatile memory device 247 is not limited to comprising NAND flash memories. For example, the nonvolatile memory device 247 could alternatively comprise nonvolatile memories such as NOR flash memories, PRAMs, FRAMs, and MRAMs.

Data compressor 250 is connected to buffer memory 230 via system bus 210. Data compressor 250 compresses data that is temporarily stored in buffer memory 230, under the control of CPU 220. Data compressor 250 also restores compressed data that is temporarily stored in flash memory 247, under the control of CPU 220. Data compressor 250 typically stores the compressed data in a buffer memory, such as buffer memory 230.

Data compressor 250 can be implemented in software or hardware in consideration of a desired compression rate and efficiency. Also, data compressor 250 can implement any of various compression algorithms, such as Huffman coding, or another lossless compression scheme.

Power supply 260 supplies power to each of the components of SSD 1000. Power supply 260 comprises a main power supply 261 and a super capacitor 265 serving as a temporary power supply. Main power supply 261 transforms an external voltage and supplies the transformed voltage to each component. For example, where a particular component uses a voltage higher than an external voltage, main power supply 261 raises the external voltage and supplies the raised voltage to the particular component. Where a component uses a voltage lower than the external voltage, main power supply 261 drops the external voltage and supplies the dropped voltage to the component.

Super capacitor 265 temporarily supplies power to SSD 1000 in the event of an unexpected power supply failure. An unexpected power supply failure occurs, for instance, where SSD 1000 suddenly fails to receive necessary power, e.g., in a power outage. Such a power supply failure will be referred to as an unexpected power interruption.

Where an unexpected power interruption occurs in a write or erase operation of SSD 1000, SSD 1000 may experience a serious error. An example of a serious error is abnormal storage of the metadata or user data of SSD 1000 or the host system.

To prevent such data storage errors, main power supply 261 detects a level of an external voltage, and where the detected voltage level falls below a predetermined voltage level due to the occurrence of an unexpected power interruption, main power supply 261 controls super capacitor 265 to discharge. During the discharge of super capacitor 265, CPU 220 controls flash memory controller 243 to complete an ongoing write or erase operation of flash memory 247. CPU 220 also stores any metadata stored in buffer memory 230, in flash memory 247 to normally terminate an operation of SSD 1000.

FIG. 6 includes a voltage diagram and two memory diagrams illustrating the operation of nonvolatile memory system 1000 during the discharge of super capacitor 265.

Referring to FIGS. 5 and 6, in the event of an unexpected power interruption at a time t0, main power supply 261 detects the level of an external voltage during an interval t0~t1 and controls super capacitor 265 to discharge. Super capacitor 265 starts to discharge at a time t1, and CPU 220 performs an operation for coping with the unexpected power interruption. In particular, CPU 220 transfers the user data and the metadata stored in buffer memory 230 into flash memory 247. Since the discharged voltage level of super capacitor 265 decreases with time, CPU 220 must perform an operation for coping with the unexpected power interruption before a time t2, while a voltage level capable of operating SSD 1000 is supplied.

While SSD 1000 is driven by the temporary power supply due to an unexpected power interruption, CPU 220 controls data compressor 250 to compress the data stored in buffer memory 230, in order to reduce power consumption of the temporary power supply. CPU 220 controls flash memory controller 243 to store the compressed data in flash memory 247. Where all of the data stored in buffer memory 230 is compressed and transmitted to flash memory 247, the temporary power supply may be exhausted. Accordingly, in some embodiments, CPU 220 selects only important data that must be retained and transmits the selected data to data compressor 250.

Buffer memory 230 comprises a first area 231 that stores data to be provided to the host system, data received from the host system, or firmware for controlling SSD 1000. Buffer memory 230 comprises a second area 233 that stores management data (e.g., metadata such as address mapping data) generated and updated during execution of an application program.

Due to the limited amount of power stored in the temporary power supply, it may not be possible to transfer all of the data stored temporarily in buffer memory 230 to flash memory 247 in the event of an unexpected power interruption. Accordingly, in some embodiments, CPU 220 controls data compressor 250 to selectively compress only management data 233, which must be retained, and controls flash memory controller 243 to store the compressed management data in a predetermined area 249 of flash memory 247.

Although some embodiments compress and store only management data in the event of an unexpected power interruption, other types of data can also be compressed and stored in the event of an unexpected power interruption. For instance, in some embodiments, all of the data stored in buffer memory 230 may be compressed and stored in flash memory 247 in the event of an unexpected power interruption.

Figure 7:
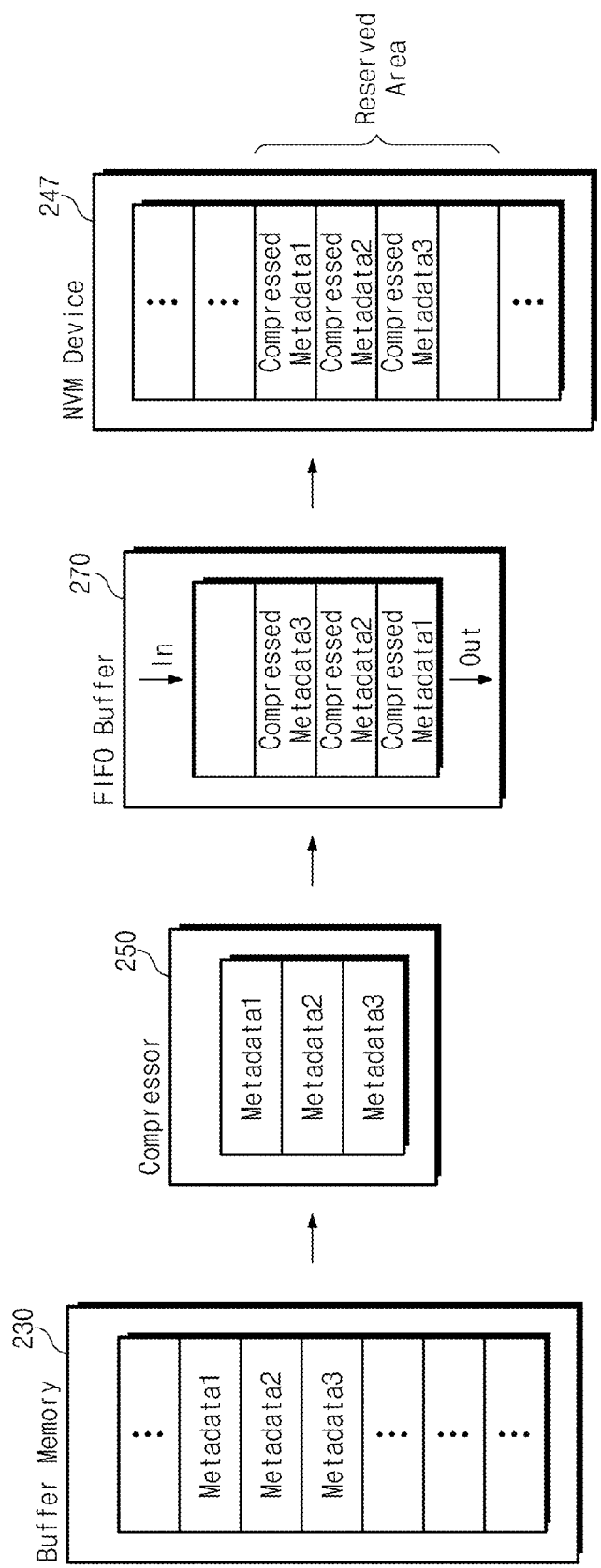
FIG. 7 is a diagram illustrating a metadata backup process performed in the event of unexpected power interruption according to an embodiment of the inventive concept.

FIG. 7 is a diagram illustrating a metadata backup process performed in the event of unexpected power interruption according to an embodiment of the inventive concept. For simplicity of explanation, FIG. 7 illustrates three units of metadata 1 through 3 stored in buffer memory 230.

Referring to FIGS. 5 and 7, where SSD 1000 is driven by the temporary power supply due to the occurrence of an unexpected power interruption, CPU 220 selects metadata 1 through 3, which must be retained, among the data stored in buffer memory 230 and transmits the selected data to data compressor 250. Control of CPU 220 controls data compressor 250 to compress the received metadata 1 through 3 and transmit the compressed metadata 1 through 3 to a buffer memory 270. In various alternative embodiments, buffer memory 270 can be incorporated in data compressor 250, buffer memory 230, or CPU 220.

Buffer memory 270 has a first in first out (FIFO) structure for transmitting the compressed metadata 1 through 3 to flash memory 247 in the order received. Once the compressed metadata 1 through 3 is stored in buffer memory 270, CPU 220 controls flash memory controller 243 to store the compressed metadata 1 through 3 in a reserved area of flash memory 247. The reserved area of flash memory 247 is typically pre-allocated by CPU 220. However, the reserved area is not limited to being pre-allocated.

Once external power is restored to SSD 1000 following an unexpected loss of power, CPU 220 uses data compressor 250 to restore the compressed metadata 1 through 3 stored in flash memory 247. Where the metadata is losslessly compressed and restored, CPU 220 stores the restored metadata in buffer memory 230 for later use. Where metadata is not losslessly compressed and restored, CPU 220 recovers the restored portion of the metadata and stores it in buffer memory 230 for later use.

Figure 8:
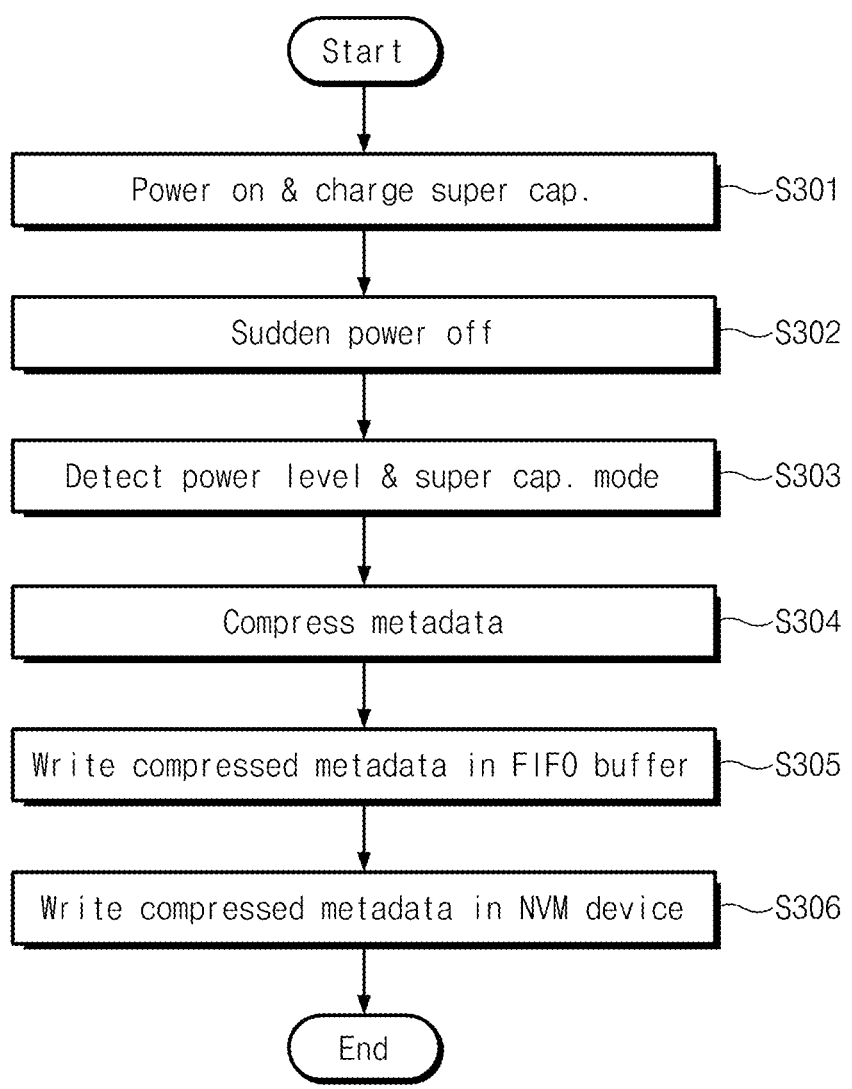
FIG. 8 is a flow chart illustrating a metadata backup process performed in the event of unexpected power interruption according to an embodiment of the inventive concept.

FIG. 8 is a flow chart illustrating a metadata backup process performed in the event of unexpected power interruption according to an embodiment of the inventive concept.

Referring to FIGS. 5 and 8, SSD 1000 performs operations requested by the host system. For example, SSD 1000 performs read and write operations on certain sectors based on requests made by the host. During such operations, SSD 1000 maintains charge in super capacitor 265 to prepare for a possible loss of power (S301).

Where an unexpected power interruption occurs (S302), main power supply 261 detects the level of an external voltage of SSD 1000. Where the detected voltage level is lower than a predetermined voltage level, super capacitor 265 discharges under the control of main power supply 261 to supply power to SSD 1000 (S303).

CPU 220 selects metadata to be retained from among the data stored in buffer memory 230 and transmits the selected metadata to data compressor 250. Upon receiving the metadata, data compressor 250 compresses the metadata under the control of CPU 220 (S304). The compressed metadata is temporarily stored in buffer memory 270 of FIG. 7 under the control of CPU 220 (S305).

Where all of the compressed metadata is stored in buffer memory 270, CPU 220 controls flash memory controller 243 to store the compressed metadata in the reserved area of flash memory 247 (S306).

Figure 9B:
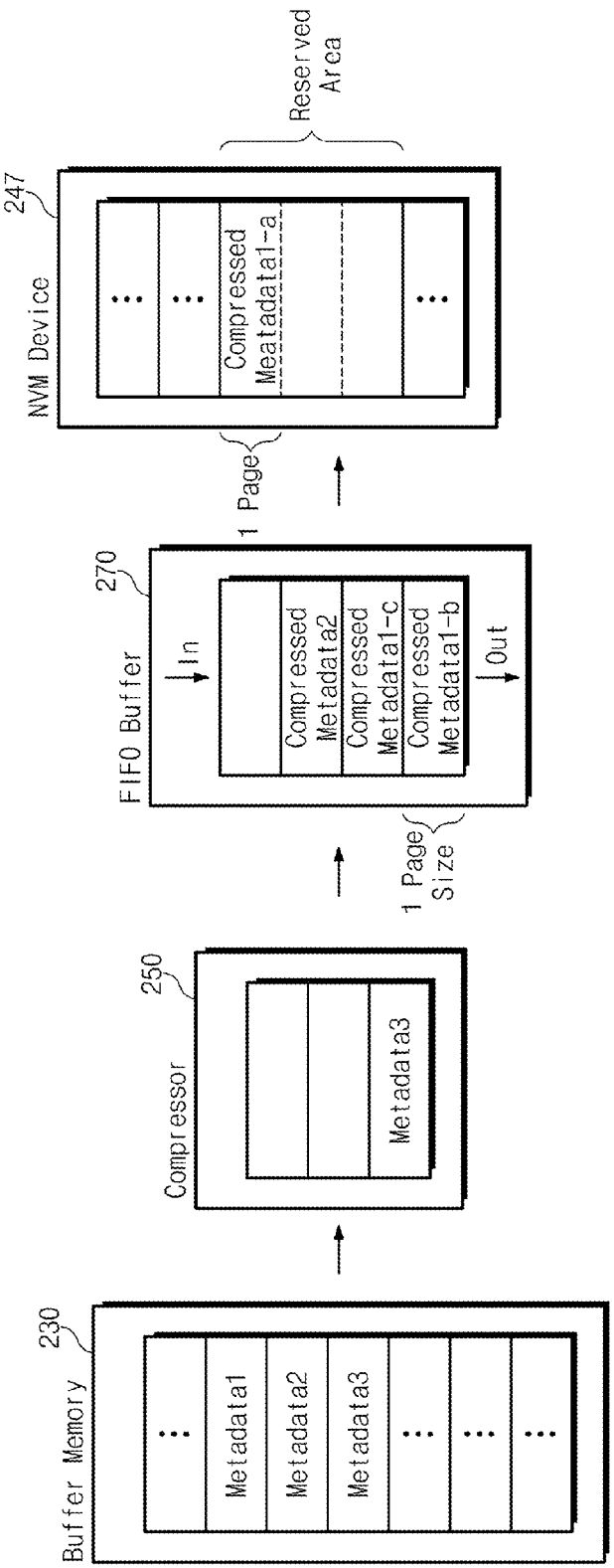

FIGS. 9A and 9B are diagrams illustrating a metadata backup process performed in the event of unexpected power interruption according to an embodiment of the inventive concept. For simplicity in description, FIGS. 9A and 9B illustrate three units of metadata 1 through 3 comprising management data stored in buffer memory 230.

Referring to FIGS. 5 and 9A, where SSD 1000 is driven by the temporary power supply due to the occurrence of an unexpected power interruption, CPU 220 selects metadata to be retained from among the data stored temporarily in buffer memory 230, compresses the selected metadata, and stores the compressed metadata in flash memory 247. CPU 220 performs compression of the metadata and storage of the compressed metadata in parallel. In particular, CPU 220 controls data compressor 250 to compress the metadata 1, and controls flash memory controller 243 to store the compressed metadata 1 in flash memory 247. While flash memory controller 243 stores the compressed metadata 1 in flash memory 247, CPU 220 controls data compressor 250 to compress metadata 2. CPU 220 similarly processes metadata 2 and metadata 3 in parallel.

Referring to FIGS. 5 and 9B, where SSD 1000 is driven by the temporary power supply due to the occurrence of an unexpected power interruption, CPU 220 selects metadata 1 through 3 to be retained from among the data stored in buffer memory 230 and transmits metadata 1 and 2 to data compressor 250. Under the control of CPU 220, data compressor 250 compresses the received metadata 1 through 3 and transmits the compressed metadata 1 and 2 to buffer memory 270.

Since flash memory 247 performs write operations in page units, buffer memory 270 temporarily stores the compressed metadata, which may comprise more than one page, prior to storage in flash memory 247. In various alternative embodiments, buffer memory 270 can be incorporated in data compressor 250, in a portion of buffer memory 230, or in a buffer memory of CPU 220.

Buffer memory 270 has a FIFO structure, and therefore the compressed metadata 1 and 2 is transmitted from buffer memory 270 to flash memory 247 in the order received. Buffer memory 270 is configured to store data in page units, which is the write unit of flash memory 247. Accordingly, in the example of FIG. 9B, metadata 1 is divided into pages 1-*a* and 1-*b* for storage in buffer memory 270.

CPU 220 controls flash memory controller 243 to store compressed metadata 1-*a* in the reserved area of flash memory 247. The reserved area of flash memory 247 is typically pre-allocated by CPU 220. However, the reserved area is not limited to being pre-allocated.

While the compressed metadata 1-*a* is being stored in flash memory 247, CPU 220 transmits the compressed metadata 2 to buffer memory 270 and transmits metadata 3 to data compressor 250. That is, CPU 220 may perform the compression of the metadata and the storage of the compressed metadata in flash memory 247 in parallel.

Where power is normally supplied to SSD 1000, CPU 220 uses data compressor 250 to restore the compressed metadata 1 through 3 stored in flash memory 247. Where the metadata is losslessly compressed and restored, CPU 220 stores the restored metadata in buffer memory 230 for later use. Where metadata is not losslessly compressed and restored, CPU 220 recovers any recoverable portion of the metadata and stores it in buffer memory 230 for later use.

FIG. 10 is a flow chart illustrating a metadata backup process performed in the event of unexpected power interruption according to an embodiment of the inventive concept.

Referring to FIGS. 5 and 10, SSD 1000 performs operations requested by the host system. For example, SSD 1000 performs read and write operations on certain sectors based on requests made by the host. During such operations, SSD 1000 maintains charge in super capacitor 265 to prepare for a possible loss of power (S401).

Where an unexpected power interruption occurs (S402), main power supply 261 detects the level of an external voltage of SSD 1000. Where the detected voltage level is lower than a predetermined voltage level, super capacitor 265 discharges under the control of main power supply 261 to supply power to SSD 1000 (S403).

CPU 220 selects metadata to be retained from among the data stored in buffer memory 230 and transmits the selected metadata to data compressor 250. Upon receiving the metadata, data compressor 250 compresses the metadata under the control of CPU 220 (S404). The compressed metadata is temporarily stored in one page units in buffer memory 270 of FIG. 9B under the control of CPU 220 (S405). Next, CPU 220 determines whether buffer memory 270 is full or whether all of the required metadata in buffer memory 230 has been transferred to buffer memory 270 (S406). If so, (S406=Yes), CPU 220 controls flash memory controller 243 to store the compressed metadata of the 1-page size of flash memory 247 in the reserved area of flash memory 247 (S407). Otherwise (S406=No), the method returns to step S404. In other words, CPU 220 controls data compressor 250 to compress additional metadata and store the compressed metadata in buffer memory 270. CPU 220 typically performs the compression of the metadata and the storage of the compressed metadata in flash memory 247 in parallel.

Figure 11:
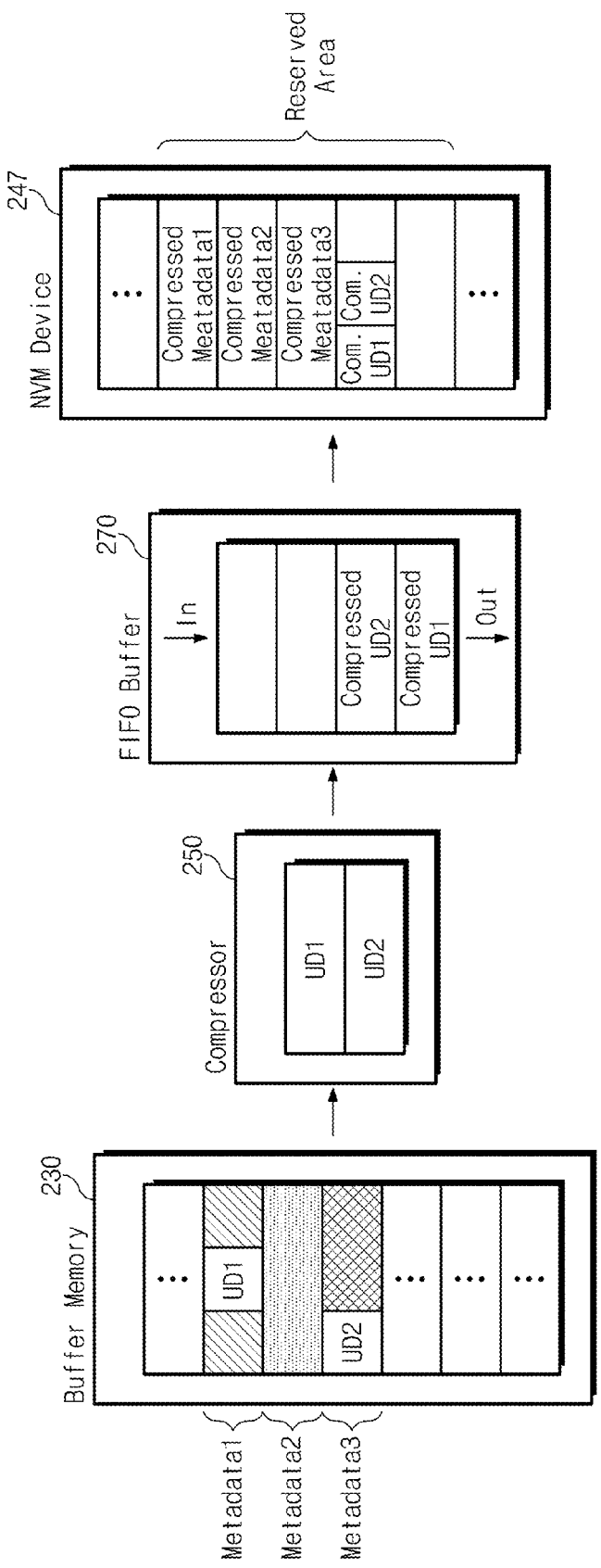
FIG. 11 is a diagram illustrating a metadata backup process performed in the event of unexpected power interruption according to an embodiment of the inventive concept.

FIG. 11 is a diagram illustrating a metadata backup process performed in the event of unexpected power interruption according to further embodiments of the inventive concept. For simplicity in description, FIG. 11 illustrates that three metadata 1 through 3 constitute the management data stored in buffer memory 230.

Referring to FIGS. 5 and 11, CPU 220 controls data compressor 250 to compress metadata 1 through 3 stored in buffer memory 230, during a standby time where there is no request command (e.g., a data read/write command) from the host system (not illustrated). CPU 220 also controls flash memory controller 243 to store the compressed metadata 1 through 3 in the reserved area of flash memory 247 during the standby time.

Where SSD 1000 is driven by the temporary power supply due to an unexpected power interruption, CPU 220 selects only updated portions of metadata 1 through 3 from among the data stored in buffer memory 230, and transmits the selected portions to data compressor 250.

Since metadata 1 through 3 stored in buffer memory 230 is compressed during the standby time, CPU 220 selects, compresses and stores only updated portions UD1 and UD2 in the event that SSD 1000 is driven by the temporary power supply due to the occurrence of an unexpected power interruption. The updated metadata UD1 and UD2 comprise metadata that is updated since a last time metadata 1 through 3 were compressed and stored during the standby time.

Upon receiving the updated metadata UD1 and UD2, data compressor 250 compresses the updated metadata UD1 and UD2 and transmits the compressed metadata UD1 to UD2 to buffer memory 270 under the control of CPU 220.

Because flash memory 247 performs write operations in page units, buffer memory 270 stores the compressed metadata in page units prior to storage in flash memory 247. In various alternative embodiments, buffer memory 270 can be incorporated in data compressor 250, in a portion of buffer memory 230, or in a buffer memory of CPU 220.

Buffer memory 270 typically has a FIFO structure. Thus, updated metadata UD1 and UD2 compressed by data compressor 250 is transmitted from buffer memory 270 to flash memory 247 in the order in which it was received in buffer memory 270.

Where all of the compressed metadata UD1 through UD3 is stored in buffer memory 270, CPU 220 controls flash memory controller 243 to store the compressed metadata UD1 and UD2 in a reserved area of flash memory 247. The reserved area of flash memory 247 is typically pre-allocated by CPU 220. However, the reserved area is not limited to being pre-allocated.

Where external power is restored to SSD 1000, CPU 220 uses data compressor 250 to restore the compressed metadata 1 through 3 stored in flash memory 247. Where the metadata is losslessly compressed and restored, CPU 220 stores the restored metadata in buffer memory 230 for later use. Where metadata is not losslessly compressed and restored, CPU 220 recovers any recoverable portion of the metadata and stores it in buffer memory 230 for later use.

Figure 12:
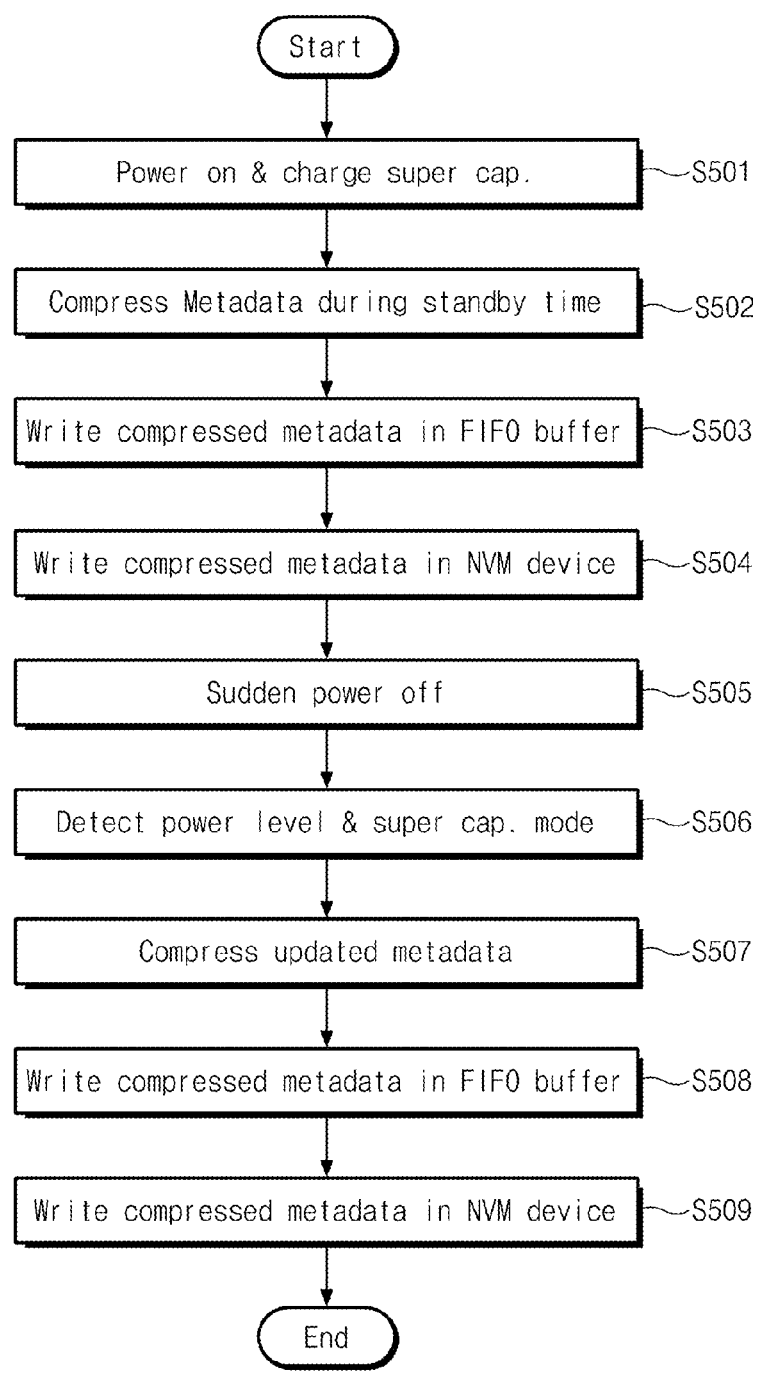
FIG. 12 is a flow chart illustrating a metadata backup process performed in the event of unexpected power interruption according to an embodiment of the inventive concept.

FIG. 12 is a flow chart illustrating a metadata backup process performed in the event of unexpected power interruption according to an embodiment of the inventive concept.

Referring to FIGS. 5 and 12, SSD 1000 performs memory access operations in response to requests from the host system. For example, SSD 1000 performs read and write operations in response to corresponding read and write requests. During normal operation of SSD 1000, super capacitor 265 is charged up (S501).

During a standby time where no request is received from the host system, CPU 220 selects metadata stored in buffer memory 230 and transmits the metadata to data compressor 250. Data compressor 250 compresses the received metadata under the control of CPU 220 (S502).

During the standby time, CPU 220 transmits the compressed metadata to buffer memory 270 of FIG. 11 under the control of CPU 220 (S503). Where all of the compressed metadata is stored in buffer memory 270, CPU 220 controls flash memory controller 243 to store the compressed metadata in the reserved area of flash memory 247 (S504).

Where an unexpected power interruption occurs (S505), main power supply 261 detects the level of an external voltage of SSD 1000. Where the detected voltage level is lower than a predetermined voltage level, super capacitor 265 discharges under the control of main power supply 261 to supply power to SSD 1000 (S506).

CPU 220 selects updated portions of the metadata stored in buffer memory 230 and transmits the selected portions to data compressor 250. The updated portions are portions of the metadata that are different from those already stored in flash memory 247. Data compressor 250 compresses the updated metadata under the control of CPU 220 (507). The compressed metadata is temporarily stored in buffer memory 270 under the control of CPU 220 (S508).

Where all of the compressed metadata is stored in buffer memory 270, CPU 220 controls flash memory controller 243 to store the compressed metadata in the reserved area of flash memory 247 (S509).

Figure 13:
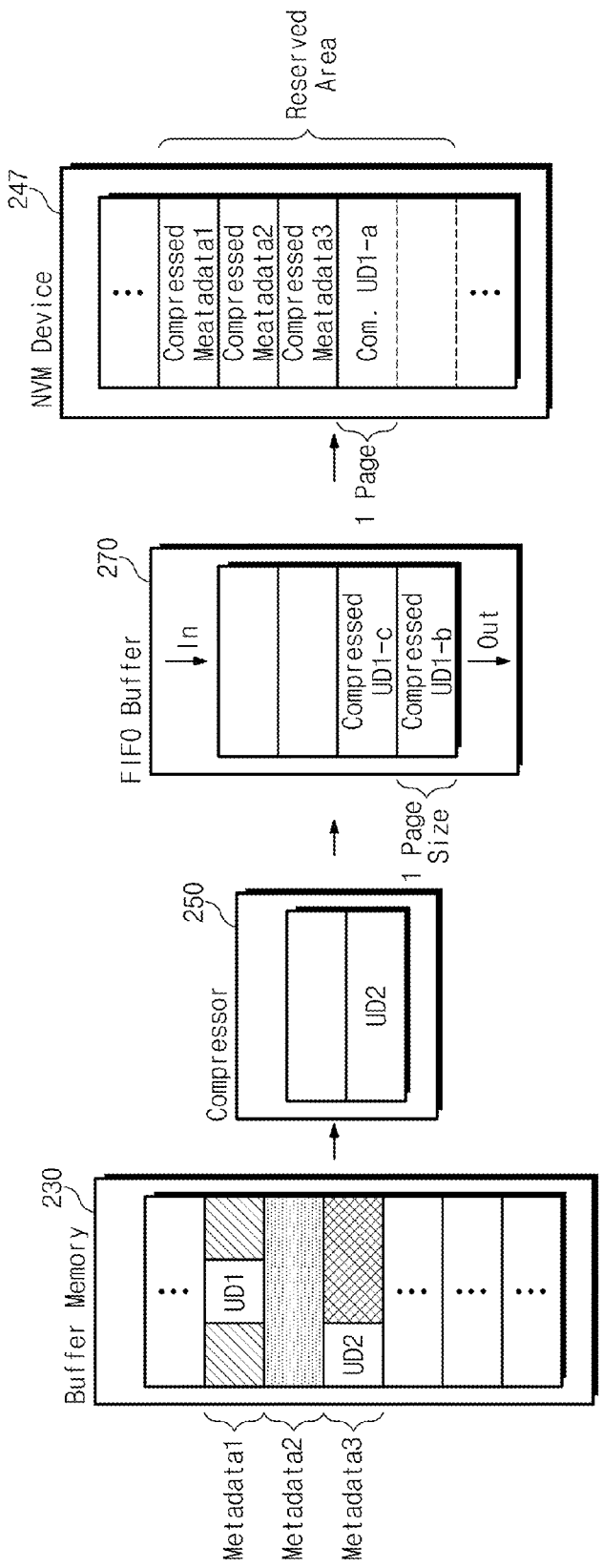
FIG. 13 is a diagram illustrating a metadata backup process performed in the event of unexpected power interruption according to an embodiment of the inventive concept.

FIG. 13 is a diagram illustrating a metadata backup process performed in the event of unexpected power interruption according to an embodiment of the inventive concept. For simplicity of explanation, FIG. 13 illustrates three units of metadata 1 through 3 stored in buffer memory 230.

Referring to FIGS. 5 and 13, CPU 220 controls data compressor 250 to compress metadata 1 through 3 during a standby time where no request is received from the host system (not illustrated). CPU 220 controls flash memory controller 243 to store the compressed metadata 1 through 3 in the reserved area of flash memory 247. CPU 220 may control flash memory controller 243 to store metadata 1 through 3 in flash memory 247 during the standby time where no request is received from the host system.

Where SSD 1000 is driven by the temporary power supply due to the occurrence of an unexpected power interruption, CPU 220 selects only updated portions of metadata 1 through 3 from among the data stored in buffer memory 230 and transmits the updated portions to data compressor 250.

Because metadata 1 through 3 stored in buffer memory 230 is compressed during the standby time, where SSD 1000 is driven by the temporary power supply due to the occurrence of an unexpected power interruption, CPU 220 selects, compresses and stores only updated portions UD1 and DU2 of metadata 1 through 3. The updated metadata UD1 and UD2 are metadata that have been updated since a last time where metadata 1 through 3 were compressed and stored during the standby time.

Data compressor 250 compresses the updated metadata UD1 and UD2 under the control of CPU 220. Data compressor 250 also transmits the compressed metadata UD1 and UD2 to buffer memory 270 under the control of CPU 220.

Since flash memory 247 performs a write operation on a page basis, buffer memory 270 stores the compressed metadata in page units prior to storage in flash memory 247. In various alternative embodiments, buffer memory 270 is incorporated in data compressor 250, in a portion of buffer memory 230, or in a buffer memory of CPU 220.

Buffer memory 270 is configured with a FIFO structure. Thus, the compressed metadata UD1 and UD2 compressed by data compressor 250 are transmitted from buffer memory 270 to flash memory 247 in the order received by buffer memory 270. Buffer memory 270 stores data in page units for conformity with the page units of flash memory 247. For instance, buffer memory 270 may divide the compressed and updated metadata UD1 into page-sized units UD1-*a* UD1-*b*, and so on.

Once the compressed metadata UD1-*a* of flash memory 247 is stored in buffer memory 270, CPU 220 controls flash memory controller 243 to store the compressed metadata UD1-*a* in the reserved area of flash memory 247. The reserved area of flash memory 247 is typically pre-allocated by CPU 220. However, the reserved area is not limited to being pre-allocated.

While the compressed metadata UD1-*a* is being stored in flash memory 247, CPU 220 transmits updated metadata UD2 to data compressor 250. That is, CPU 220 causes compression of the meta data and storage of the metadata in flash memory 247 to be performed in parallel.

Where external power is restored to SSD 1000, CPU 220 uses data compressor 250 to restore the compressed metadata 1 through 3 stored in flash memory 247. Where the metadata is losslessly compressed and restored, CPU 220 stores the restored metadata in buffer memory 230 for later use. Where metadata is not losslessly compressed and restored, CPU 220 recovers any recoverable portion of the metadata and stores it in buffer memory 230 for later use.

Figure 14:
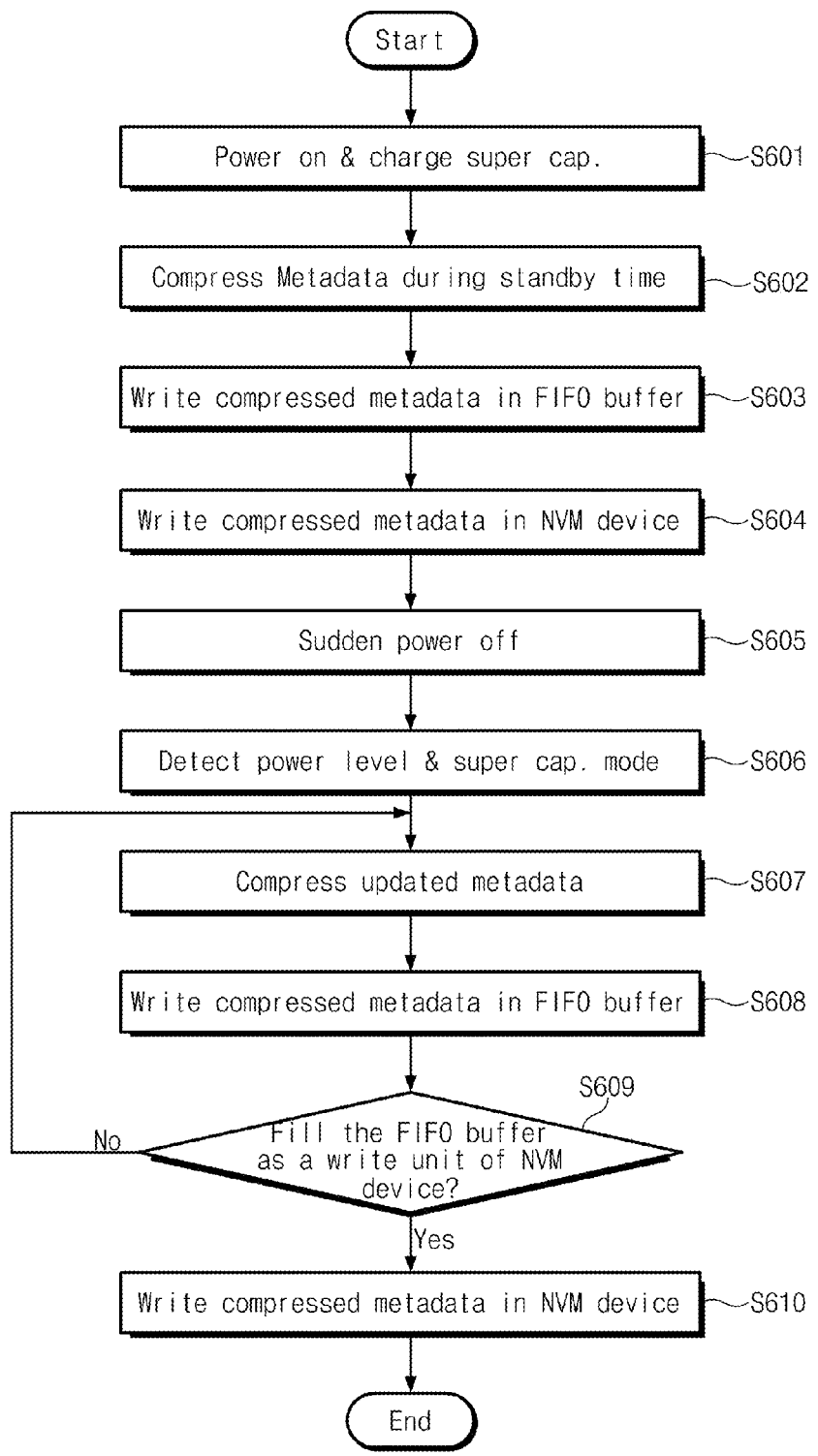
FIG. 14 is a flow chart illustrating a metadata backup process performed in the event of unexpected power interruption according to an embodiment of the inventive concept.

FIG. 14 is a flow chart illustrating a metadata backup process performed in the event of unexpected power interruption according to an embodiment of the inventive concept.

Referring to FIGS. 5 and 14, SSD 1000 performs operations such as read and write operations in response to requests from the host system. At the same time, super capacitor 265 charges up (S601).

During a standby time where no request is received from the host system, CPU 220 selects the metadata stored in buffer memory 230 and transmits the selected metadata to data compressor 250. Data compressor 250 compresses the received metadata under the control of CPU 220 (S602).

During the standby time, CPU 220 transmits the compressed metadata to buffer memory 270 of FIG. 13 under the control of CPU 220 (S603). Where all of the compressed metadata is stored in buffer memory 270, CPU 220 controls flash memory controller 243 to store the compressed metadata in the reserved area of flash memory 247 (S604).

Where an unexpected power interruption occurs (S605), main power supply 261 detects the level of an external supply voltage of SSD 1000. Where the detected voltage level falls below a predetermined voltage level, super capacitor 265 discharges under the control of main power supply 261 to supply power to SSD 1000 (S606).

CPU 220 selects only updated portions of the metadata stored in buffer memory 230 and transmits the selected metadata to data compressor 250. Data compressor 250 receives and compresses the updated metadata under the control of CPU 220 (607), and the compressed metadata is temporarily stored in buffer memory 270 under the control of CPU 220 (S608).

The compressed metadata is stored in buffer memory 270, in page units using a FIFO configuration (S609), and CPU 220 controls flash memory controller 243 to store the compressed metadata in the reserved area of flash memory 247 (S610). CPU 220 can control storage of the compressed metadata in buffer memory 270 so that it is performed in parallel with compression with other metadata to be stored in flash memory 247.

Where external power is restored to SSD 1000, CPU 220 controls data compressor 250 to restore the compressed metadata 1 through 3 stored in flash memory 247. Where the metadata is losslessly compressed and restored, CPU 220 stores the restored metadata in buffer memory 230 for later use. Where metadata is not losslessly compressed and restored, CPU 220 recovers any recoverable portion of the metadata and stores it in buffer memory 230 for later use.

Figure 15:
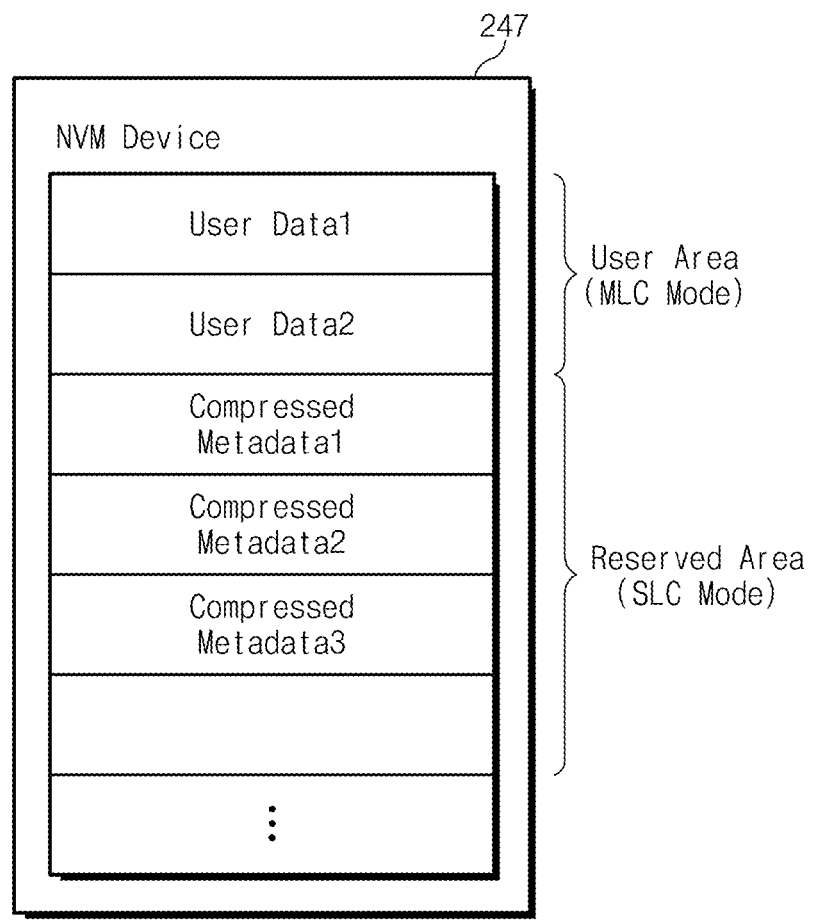
FIG. 15 is a diagram illustrating an operation mode of a flash memory according to an embodiment of the inventive concept.

FIG. 15 is a diagram illustrating an operating mode of flash memory 247 according to an embodiment of the inventive concept.

Referring to FIGS. 5 and 15, where an unexpected power interruption occurs, SSD 1000 compresses metadata stored in buffer memory 230 and stores the compressed metadata in flash memory 247. CPU 220 controls the operation of storing the compressed metadata within a time interval while the temporary power supply provides power. To ensure adequate speed in storing the metadata, flash memory 247 can be configured to operate in various modes according to an input command from the host. As one example mode, flash memory 247 can operate certain regions of memory cells as single level cells (SLCs) that can be programmed more quickly than multilevel cells. Accordingly, where power is unexpectedly lost, SSD 1000, can receive the metadata before the temporary power supply is exhausted.

CPU 220 controls the memory cell operation scheme so that data is stored using an SLC scheme in an area allocated to store the compressed metadata. CPU 220 also controls the memory cell operation scheme so that data is stored through in a multi-level cell (MLC) scheme in an area allocated to store user data 1 and 2 requested by the host system to be written. The memory cell operation scheme (the SLC or MLC scheme) may vary according to the command that is provided by CPU 220 to flash memory 247.

Figure 16:
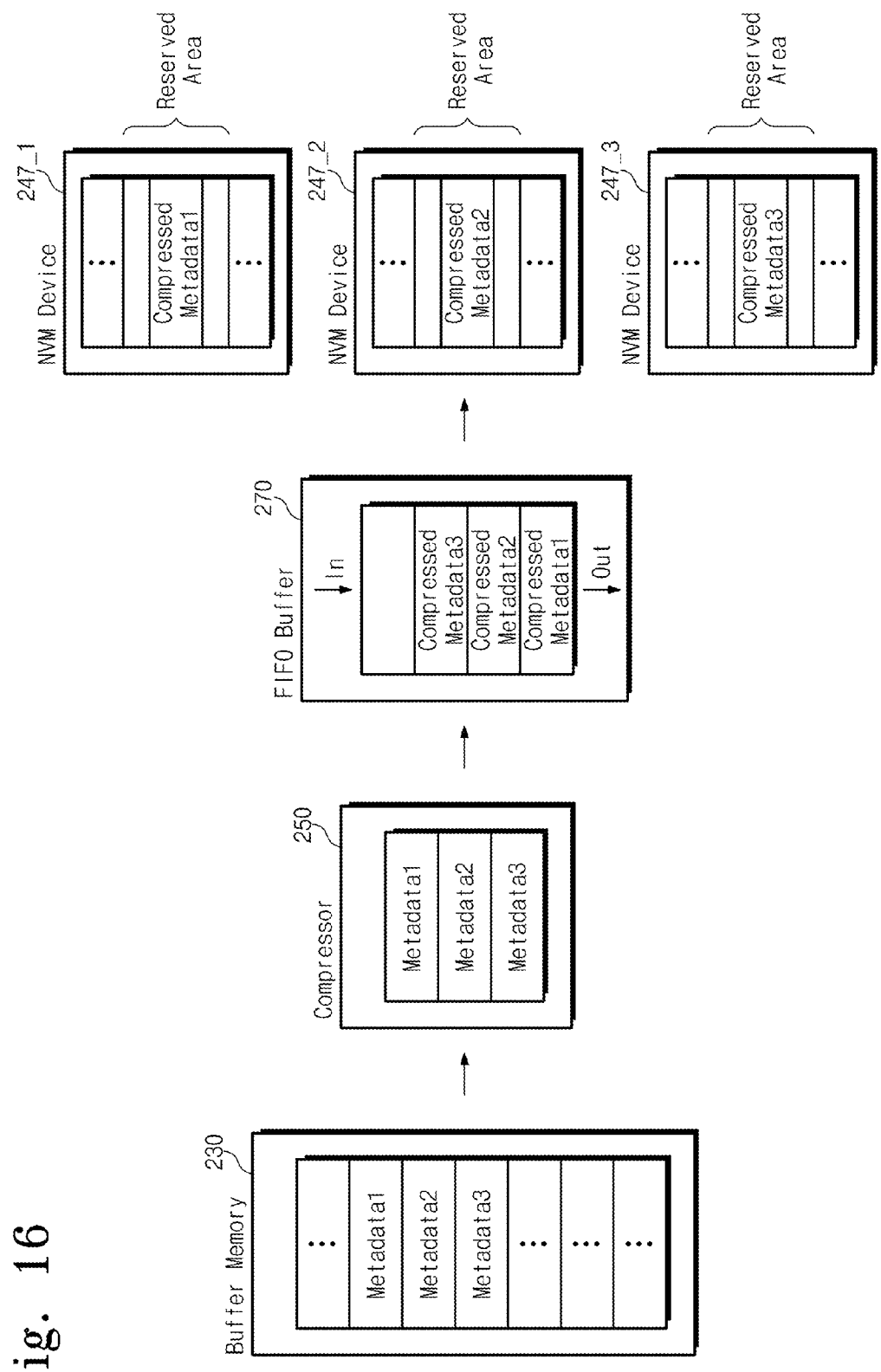
FIG. 16 is a diagram illustrating a metadata backup process performed in the event of unexpected power interruption according to an embodiment of the inventive concept.

FIG. 16 is a diagram illustrating a metadata backup process performed in the event of unexpected power interruption according to an embodiment of the inventive concept. For simplicity of explanation, FIG. 16 illustrates three metadata 1 through 3 as the management data stored in buffer memory 230.

Referring to FIGS. 5 and 16, where SSD 1000 is driven by the temporary power supply due to the occurrence of an unexpected power interruption, CPU 220 selects metadata 1 through 3 to be retained from among the data stored in buffer memory 230 and transmits the selected metadata to data compressor 250. Data compressor 250 compresses the received metadata 1 through 3 under the control of CPU 220. Also, under the control of CPU 220, data compressor 250 transmits the compressed metadata 1 through 3 to buffer memory 270.

Since flash memory 247 performs write operations on a page basis, buffer memory 270 temporarily stores the compressed metadata in page units prior to storage in flash memory 247. In various alternative embodiments, buffer memory 270 is incorporated in data compressor 250, in a portion of buffer memory 230, or in a buffer memory of CPU 220.

Buffer memory 270 has a FIFO structure, and therefore the compressed metadata 1 and 2 is transmitted from buffer memory 270 to flash memory 247 in the order received by buffer memory 270.

Where all of the compressed metadata 1 through 3 is stored in buffer memory 270, CPU 220 controls flash memory controller 243 to store the compressed metadata 1 through 3 in a plurality of flash memories in a distributed manner. For example, if SSD 1000 has a multi channel architecture and comprises a plurality of flash memories for each channel, CPU 220 may operate a plurality of flash memories in parallel. Thus, CPU 220 may store the compressed metadata 1 through 3 in the reserved areas of flash memories 247_1, 247_2 and 247_3 in a distributed manner.

Where the external power is restored to SSD 1000, CPU 220 uses data compressor 250 to restore the compressed metadata 1 through 3 stored in flash memory 247. Where the metadata is losslessly compressed and restored, CPU 220 stores the restored metadata in buffer memory 230 for later use. Where metadata is not losslessly compressed and restored, CPU 220 recovers any recoverable portion of the metadata and stores the resulting metadata in buffer memory 230 for later use.

Figure 17:
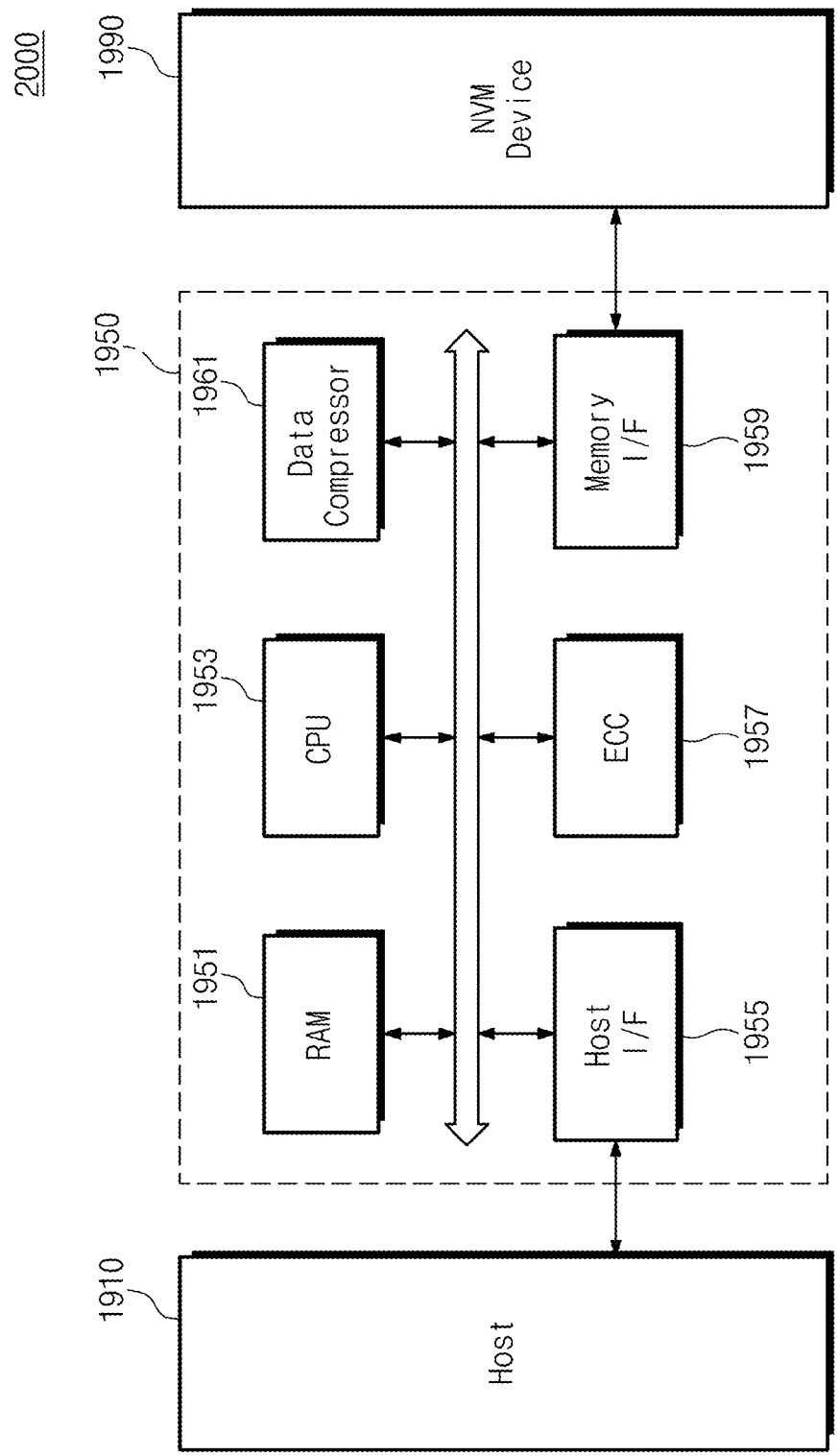
FIG. 17 is a block diagram of a nonvolatile memory system according to an embodiment of the inventive concept.

FIG. 17 is a block diagram of a nonvolatile memory system 2000 according to an embodiment of the inventive concept.

Referring to FIG. 17, nonvolatile memory system 2000 comprises a memory controller 1950 and a nonvolatile memory device 1990.

Memory controller 1950 is connected to a host 1910 and nonvolatile memory device 1990. Memory controller 1950 is configured to access nonvolatile memory device 1990 in response a request from host 1910. For example, memory controller 1950 is configured to control a read/write/erase operation of nonvolatile memory device 1990. Memory controller 1950 is configured to provide an interface between nonvolatile memory device 1990 and host 1910. Memory controller 1950 is configured to drive firmware for controlling nonvolatile memory device 1990.

Memory controller 1950 comprises a random access memory (RAM) 1951, a CPU 1953, a host interface (I/F) 1955, an error correction unit 1957 using error correction codes (ECCs), a memory interface 1959, and a data compressor 1961. RAM 1951 is used as a working memory of CPU 1953. CPU 1953 controls the overall operation of memory controller 1950.

The host interface implements a protocol for data exchange between host 1910 and memory controller 1950. For example, memory controller 1950 may be configured to communicate with an external device (e.g., host 1910) through one of various interface protocols such as universal serial bus (USB) protocol, multimedia card (MMC) protocol, peripheral component interconnection (PCI) protocol, PCI-Express (PCI-E) protocol, advanced technology attachment (ATA) protocol, serial ATA (SATA) protocol, enhanced small disk interface (ESDI) protocol, and integrated drive electronics (IDE) protocol.

Error correction unit 1957 is configured to detect and correct errors in data read from nonvolatile memory device 1990. Error correction unit 1957 is typically provided as a component of memory controller 1950; however, error correction unit 1957 can also be provided as a component of nonvolatile memory device 1990. The memory interface interfaces with nonvolatile memory device 1990.

Data compressor 1961 compresses metadata that is temporarily stored in RAM 1951 in the event of an unexpected power interruption in nonvolatile memory system 2000. Where power is restored to nonvolatile memory system 2000 after an unexpected power interruption, data compressor 1961 restores compressed metadata stored in nonvolatile memory device 1990. The compressed metadata is stored in nonvolatile memory device 1990 under the control of CPU 1953. Although not illustrated in FIG. 17, nonvolatile memory system 2000 further comprises a read-only memory (ROM) that stores code data for implementing an interface with host 1910.

In certain embodiments, memory controller 1950 and nonvolatile memory device 1990 are integrated into one semiconductor device to constitute a memory card. For example, memory controller 1950 and nonvolatile memory device 1990 can be integrated into one semiconductor device to constitute a memory card such as a personal computer memory card international association (PCMCIA) card, a compact flash (CF) card, a smart media card, a memory stick, a multimedia card (e.g., MMC, RS-MMC and MMC-micro), a secure digital (SD) card (e.g., SD, mini-SD, micro-SD and SDHC), and a universal flash storage (UFS).

As another example, nonvolatile memory system 2000 may comprise or be incorporated in a solid state drives (SSD), computer, portable computer, ultra mobile personal computer (UMPC), work station, net-book, personal digital assistant (PDA), web tablet, wireless phone, mobile phone, digital camera, digital audio recorder, digital audio player, digital video recorder, digital video player, a device capable of transmitting/receiving information in wireless environments, one of various electronic devices constituting a home network, one of various electronic devices constituting a computer network, one of various electronic devices constituting a telematics network, RFID devices, or embedded systems.

Nonvolatile memory device 1990 or nonvolatile memory system 2000 may be mounted in various types of packages. Examples of the packages for nonvolatile memory device 1990 or nonvolatile memory system 2000 comprise package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), and wafer-level processed stack package (WSP).

As described above, the nonvolatile memory systems according to the embodiments of the inventive concept compress and store metadata in the nonvolatile memory devices in the event of unexpected power interruption, thus enabling rapid and stable backup of the metadata.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A nonvolatile memory system, comprising:
a first memory configured to temporarily store metadata;
a second memory comprised of a nonvolatile memory device configured to store compressed metadata; and
a control unit configured to compress the metadata stored in the first memory while power is alternatively supplied to the nonvolatile memory system in the event of an unexpected power supply failure, and further configured to control the second memory to store the compressed metadata.

2. The nonvolatile memory system of claim 1, wherein compressing the metadata and controlling the second memory to store the compressed metadata are performed in parallel.

3. The nonvolatile memory system of claim 1, further comprising a buffer memory configured to store the compressed metadata.

4. The nonvolatile memory system of claim 3, wherein the compressed metadata is transmitted to the second memory from the buffer memory in units corresponding to a write unit of the nonvolatile memory device.

5. The nonvolatile memory system of claim 4, wherein the buffer memory receives and transmits the compressed metadata in a first-in-first-out fashion.

6. The nonvolatile memory system of claim 3, wherein the buffer memory is a reserved area of the first memory or is incorporated in the control unit.

7. The nonvolatile memory system of claim 1, wherein the metadata is stored in the nonvolatile memory device during a standby operation during which the control unit receives no read or write request from an external device.

8. The nonvolatile memory system of claim 7, wherein the control unit compresses only updated metadata among the metadata stored in the first memory while power is supplied to the nonvolatile memory system from a temporary power supply.

9. The nonvolatile memory system of claim 1, wherein the nonvolatile memory device comprises a reserved area allocated to store the compressed metadata.

10. The nonvolatile memory system of claim 9, wherein the reserved area is configured to operate in a single-level cell mode.

11. The nonvolatile memory system of claim 1, wherein the compressed metadata is transmitted to the nonvolatile memory device in a distributed manner.

12. The nonvolatile memory system of claim 1, wherein the nonvolatile memory system is a solid state drive (SSD) comprising a plurality of flash memory devices.

13. A method of managing data in a nonvolatile memory system including a nonvolatile memory device, the nonvolatile memory system being driven by an auxiliary power supply in the event of an unexpected power supply failure, the method comprising:
compressing metadata to be stored in the nonvolatile memory system to generate compressed metadata;
storing the compressed metadata in a first memory as temporarily-stored compressed metadata; and
storing the temporarily-stored compressed metadata in the nonvolatile memory device.

14. The method of claim 13, wherein the compressing of the metadata to generate the compressed metadata, and the storing of the compressed metadata as temporarily-stored metadata are performed in parallel.

15. The method of claim 13, wherein the storing of the temporarily-stored metadata in the nonvolatile memory device is performed during a standby period during which no read or write request is received by a memory controller of the nonvolatile memory system from an external device.

16. The method of claim 15, wherein the metadata comprises updated metadata, and the method further comprises:
compressing only the updated metadata while the nonvolatile memory system is being driven by the auxiliary power supply; and
storing the compressed updated metadata in the nonvolatile memory device.

17. The method of claim 16, wherein the compressing of only the updated metadata and the storing of the compressed updated metadata are performed in parallel.

18. The method of claim 13, wherein the nonvolatile memory device comprises a reserved area storing the temporarily-stored compressed metadata.

19. The method of claim 13, wherein the temporarily-stored compressed metadata is transmitted to the nonvolatile memory device in a distributed manner.

20. The method of claim 19, wherein the reserve area of the nonvolatile memory device operates in accordance with at least one single-level cell operating mode.

21. The method of claim 13, wherein the auxiliary power supply is an internal power supply.

22. The method of claim 13, wherein the auxiliary power supply is a super capacitor.

23. The method of claim 13, wherein the first memory is a volatile memory device.

* * * * *